United States Patent [19]

Riemer

[11] Patent Number: 4,583,042
[45] Date of Patent: Apr. 15, 1986

[54] CAPACITIVE CIRCUIT BOARD TESTING SYSTEM AND METHOD USING A CONDUCTIVE PLIANT ELASTOMERIC REFERENCE PLANE

[75] Inventor: Dietrich E. Riemer, Auburn, Wash.

[73] Assignee: The Boeing Company, Seattle, Wash.

[21] Appl. No.: 486,096

[22] Filed: Apr. 18, 1983

[51] Int. Cl.[4] .............................................. G01R 31/02
[52] U.S. Cl. ................................ 324/73 PC; 324/51; 324/158 F
[58] Field of Search ............ 324/73 PC, 158 P, 158 F, 324/60 R, 60 C, 51

[56] References Cited

U.S. PATENT DOCUMENTS

| | | | |
|---|---|---|---|
| 3,975,680 | 8/1976 | Webb | 324/73 PC X |
| 4,012,693 | 3/1977 | Sullivan | 324/73 PC |
| 4,017,793 | 4/1977 | Haines | 324/73 PC |
| 4,056,773 | 11/1977 | Sullivan | 324/73 PC |
| 4,164,704 | 8/1979 | Kato et al. | 324/73 PC |
| 4,229,693 | 10/1980 | Irick et al. | 324/73 PC |

OTHER PUBLICATIONS

Suzuki et al., *Development of Automated Testing Device for Multi-Layer Ceramic Substrate* International Microelectronics Conf. Tokyo May 24–26, 1982, pp. 197–190.
Wedwick, Robert W., *Continuity Testing by Capacitance*, Circuits Manufacture, Nov. 1974, pp. 60, 61.

Primary Examiner—Gerard R. Strecker
Attorney, Agent, or Firm—Hughes & Cassidy

[57] ABSTRACT

A capacitance measuring circuit board test system (10, 10') for measuring the electrical continuity and integrity of line segments (14) on a circuit board (12) including: a test stand support (20); a conductive pliant circuit board backside reference plane (19, 29, 34) carried by the support (20); means for pressing the circuit board (12) into intimate mutually coextensive face-to-face contact with the conductive pliant material (29) defining the reference plane (19, 29, 34) with the interface therebetween being devoid of air gaps; and, a capacitance measuring device (16, 40) having sensory terminals (5, 18 and 44, 45) respectively coupled to a relatively movable test probe (11, 46) and to the backside reference plane (19, 29, 34) for measuring the capacitance of the circuit board line segments (14) between n test points and the backside reference plane (19, 29, 34). The systems disclosed include methods and apparatus suitable for use with a wide variety of circuit boards (12) including single- or double-sided circuit boards, single- or multi-layer circuit boards, and circuit boards with and/or without internal ground and/or power planes; and, with a wide variety of different types of capacitance measuring devices including, for example, three point capacitance meters (16) and four point capacitance meters (40), in the latter of which current is driven through the circuit board (12) and test system (10') from a high-potential drive terminal (41) to a low-potential drive terminal (42) associated with the meter (40) while the voltage levels at the high- and low-potential sensory terminals (44, 45) are measured with the voltage drop therebetween being indicative of line segment capacitance.

15 Claims, 2 Drawing Figures

CAPACITIVE CIRCUIT BOARD TESTING SYSTEM AND METHOD USING A CONDUCTIVE PLIANT ELASTOMERIC REFERENCE PLANE

BACKGROUND OF THE INVENTION

1. Technical Field

The present invention relates generally to testing systems for testing the electrical continuity and/or integrity of conductive line segments on circuit boards; and, more particularly, to improved capacitance circuit board testing systems characterized by their simplicity, reliabilty, relatively high precision accurate capacitance readings, economy, and by their ability to permit rapid capacitance testing for n test points (where "n" may commonly comprise on the order of 500 or more line segment end points on each different circuit board), and by their ease and rapidity of removal of one board following testing and insertion of the next board for testing. To this end, the present invention provides for the use of a circuit board backside reference plane formed of conductive elastomeric material which readily conforms in shape to the backside surface configuration of the board undergoing test irrespective of board warpage, curvature and/or other unintentional irregularities and/or intentional design irregularities, thereby enabling the circuit board to be securely clamped in place with the backside surface of the board and the conductive elastomeric material in mutually coextensive face-to-face relation devoid of critical air gaps by any suitable board mounting means such, for example, as a vacuum system for urging the board to be tested against the conductive elastomeric reference plane.

2. Background Art

The need for an effective system for verifying the electrical continuity and integrity of line segments and/or circuits in circuit boards has perplexed the industry for decades. Many highly sophisticated and advanced types of circuit boards have been developed over that period of time which, unfortunately, suffer from severe production constraints imposed by known quality control techniques. For example, industry has long known how to make complex multi-layer circuit boards on a rapid mass-production basis; but, in order to sell such circuit boards, each must be separately tested prior to shipment. Such boards will commonly have many hundreds of line segments disposed in various layers, each of which must be tested for opens and/or shorts. The most reliable known way of accurately detecting the presence of an open and/or short has been by measuring the resistance of each line end point against all other line end points. However, resistance test measurements require approximately $n^2/2$ separate tests and readings for a given circuit board having n test points—e.g., n line end points—and, consequently, a board having 500 or more test points (a common and often encountered situation) requires that approximately 125,000, or more, separate resistance measurements be made. This requirement has led to the development of numerous highly expensive and complex test stands having multiple test probes which are designed for use with specific types and designs of circuit boards; and, such test equipment has proven extremely expensive, difficult to use, and, further, has been characterized by its unreliability. Moreover, the equipment is space-consuming and often characterized by its lack of versatility or universal test applicability in the manufacturing facilities of circuit board manufacturers who commonly manufacture thousands of different types of circuit boards intended for numerous different customers in different industrial applications.

The prior art is replete with representative patents illustrating the types of test fixtures that have been developed for testing electrical continuity and/or integrity of line segments in printed circuit boards. For example, U.S. Pat. Nos. 4,017,793—Haines, 4,061,969—Dean, 4,115,735—Stanford, 4,164,704—Kato et al, 4,209,745—Hines, 4,321,533—Matrone and 4,322,682—Schadwill are illustrative of printed circuit board testing heads employing a plurality of test probes generally disposed in X-Y coordinate axes arrays defining a "bed of nails" approach wherein provision is made for supporting the boards to be tested on a support enabling the underlying probes to be brought into electrical contact with the multiple test points on the circuit board. In the aforesaid Haines patent, the support comprises an elastomeric resilient foam pad; Matrone discloses the use of interchangeable plates defined as "card personalizers" intended to increase the universal applicability of the system; while Schadwill discloses a vacuum testing head. U.S. Pat. No. 4,056,773—Sullivan discloses a flexible multi-point test fixture; while U.S. Pat. No. 3,830,956—Wootton et al is representative of special printed circuit board designs incorporating test pads to facilitate testing. Other illustrative types of circuit board testing devices include those disclosed in U.S. Pat. Nos. 2,844,250—Bayha et al, 3,992,663—Seddick, and 4,186,338—Fichtenbaum.

The industry has long recognized that capacitance-type testing devices—as opposed to resistance measuring devices—represent an opportunity to significantly speed up the time required for testing electrical continuity and/or integrity in printed circuit boards since such capacitance measuring devices require only n measurements to test a board having n test points—albeit at a potential tradeoff of test accuracy and reliability since capacitance measuring systems provide only an indirect indication of the presence of shorts and/or opens; and, therefore, precise accurate capacitance readings are essential in any such device in order that it be viable for use in production test work. An early example of this type of testing system is that disclosed in an article authored by Robert W. Wedwick entitled "Continuity Testing By Capacitance", CIRCUITS MANUFACTURE, November 1974, pp. 60 and 61. In this device, measurements are made of the line capacitance in a circuit board between each line segment and an internal reference plane such as a ground or power plane; and, by then comparing measured capacitance values with the known accepted values previously determined for that particular line segment. The device employs two probes, one of which is attached to the internal ground or power plane and the other of which is sequentially engaged with the line end points to be tested. While this type of test device has proven satisfactory in use, it has found only limited application for use with those specific circuit boards containing internal ground or power planes which define a reference plane to which capacitance measurements can be referenced.

U.S. Pat. Nos. 3,975,680—Webb and 4,229,693—Irick et al are directed to capacitance testing devices which are intended to improve the versatility of the capacitance test procedure; and, in the case of the Irick et al patent, to render the capacitance test procedure suitable for use with circuit boards which do not include internal reference planes. Thus, Webb discloses a capacitance testing device which includes a superimposed coupling plate which defines, in effect, a "floating reference plane" disposed above, in close proximity to and, hopefully, coplanar with the circuit board to be tested. The coupling plate is electrically connected to one terminal of a capacitance meter and a probe connected to a second terminal on the meter is inserted through an opening in the floating reference plane and sequentially applied to the line end points on the board undergoing test. Aside from the physical disadvantages of this system in terms of loading and/or unloading circuit boards into and/or from the test fixture and physical movement of the probe and/or board relative to one another during sequential application of the probe to different line end points, other severe disadvantages are inherently imposed by the system. Thus, as previously indicated, in order that individual capacitance measurements can be employed in testing circuit boards, it is essential that the system be capable of attaining highly accurate precise measurements. Unfortunately, however, the floating reference plane system interposes an air gap between the reference plane and the board undergoing test; and, any variations in the air gap create variations in the capacitance measurements which result in erroneous readings. Moreover, variations in the air gap are inherent in this type of system for many reasons including, for example, warpage and/or curvature of the circuit board and/or the floating reference plane, as well as the physical configuration of the circuit board itself.

Apparently recognizing the foregoing limitations, Irick et al have developed a somewhat more complex capacitance testing system comprising an enclosed vacuum chamber into which each circuit board to be tested must be inserted, the chamber closed and sealed, and thereafter measuring capacitance between a backside reference plane defined by the base of the vacuum chamber and line segments by inserting a pointed probe through a thin plastic membrane defining the upper wall of the vacuum chamber and into electrical contact with the line ends for the particular line segment to be tested. Thus, not only must each circuit board be individually inserted into and removed from the enclosed vacuum chamber—a time-consuming operation—but, moreover, the very test procedure employed requires puncturing or penetrating the thin membrane defining the vacuum chamber wall n times in order to make n capacitance measurements; thereby severely denegrating the reliability of the vacuum system. Moreover, in order to make the requisite electrical contact, it is essential that the probe actually puncture the plastic membrane; and, not only has it been difficult to achieve such penetration on a consistant basis, but, in addition, it is extremely difficult to ascertain with certainty that penetration has, in fact, occurred and that electrical contact has actually been made.

Another patent of interest is U.S. Pat. No. 3,243,701—Strand which discloses a ballistic galvanometer circuit for measuring capacitance to determine the thickness of insulating coatings. In this device, the patentee employs a resilient current conducting probe which is applied to the nonconductive insulating coating on a conductive substrate with capacitance measurements providing an indication of the thickness of the nonconductive coating.

Kattner et al, U.S. Pat. No. 3,405,361 discloses a fluid actuable multi-point microprobe for testing semi-conductor chips wherein the test device employs a vacuum chuck for holding the semi-conductor chip in place.

In U.S. Pat. No. 3,596,228—Read, Jr., et al, the patentees apply hydrostatic pressure through a flexible dielectric membrane to contacts on integrated semi-conductor chips. The membrane includes a conductive elastomer which serves as a ground plane in the high frequency measurements.

An article written by L. W. Holmstrom entitled "Electrical Fixture For Printed-Circuit Assemblies", IBM TECHNICAL DISCLOSURE BULLETIN, Vol. 20, No. 8, p. 2934, January, 1978, discloses the use of a conductive elastomer to provide a compressionable medium which allows for matching irregular printed-circuit board assemblies to a fixed head plate. The conductive elastomer must include wires embedded in non-conductive material to achieve contact between terminals placed on top of each other without shorting out the printed circuit boards.

However, notwithstanding the extensive research and development work as reflected by the foregoing representative prior art disclosures, prior to the advent of the present invention there has been no effective, reliable and practical capacitance testing system for circuit boards suitable for use in manufacturing environments on circuit boards produced on a mass-production basis. Thus, the aforesaid Wedwick capacitance testing device has seen only limited application in systems suitable for testing circuit boards having internal power and/or ground planes; while capacitance measuring systems such as those disclosed in the aforesaid U.S. Pat. Nos. 3,975,680—Webb and 4,229,693—Irick et al generally find only limited application because of precise control requirements with respect to air gaps between a floating reference plane and the circuit board undergoing test, the use of plastic sheets to define an enclosed vacuum system wherein the sheets must be punctured or penetrated to establish line segment/probe contact with consequent denegration of the vacuum system, the complexities involved in loading and unloading the test fixture with successive circuit boards, and/or relative maneuverability of the test probe with respect to the n line ends on the circuit boards. The present invention overcomes all of the foregoing disadvantages and, for the first time, provides a capacitance measuring system which enables rapid, precise capacitance measurements on a continuous, easily replicated basis; while at the same time, facilitating loading and/or unloading of the test fixture and readily accommodating various known automating techniques.

SUMMARY OF THE INVENTION

A capacitance measuring circuit board test system including test procedures and test fixtures has been disclosed wherein the system can be employed to rapidly test a wide variety of different circuit boards irrespective of the presence or absence of internal power and/or ground planes and irrespective of physical irregularities in the boards resulting from warpage, curvature and/or intentional or unintentional design irregularities. To accomplish this, the test system of the invention includes a fixed support, a conductive elastomeric circuit board backside reference plane carried on the support, provision for urging the circuit board undergoing test into mutually coextensive intimate face-to-face relation with the conductive elastomeric backside reference plane (which, in the exemplary forms of the invention illustrated and described herin comprises a vacuum hold-down system), and a capacitance meter having a pair of sensory terminals, one of which is coupled to the conductive elastomeric backside reference plane and the other of which is coupled to a test probe capable of being moved relative to the circuit board for sequentially contacting all of the n test points thereon to provide a sequential series of n capacitance measurements each indicating the line segment capacitance as measured between the n test points and the conductive elastomeric reference plane. The system readily permits of incorporation of known automated and/or manual systems for relative movement of the test probe, as well as for use in conjunction with computerized systems including means for recording and/or displaying capacitance readings on a point-by-point real time basis in hard copy and/or visually, together with optional provisions for audible signals to alert the user when any given capacitance reading either falls outside of a predefined acceptance range or otherwise provides an indication of an open or a short.

More specifically, it is a general aim of the present invention to provide a simple, highly reliable capacitance measuring system for testing electrical continuity and integrity in line segments on circuit boards which permits of ease in installation and removal of substrates to be tested, and ease and rapidity of relative movement between the test probe and n test points on the circuit boards, all in an environment devoid of critical air gaps which inherently produce erroneous capacitance readings and devoid of any structure intermediate the line segments to be tested and the user and/or test probe which interfere with free rapid movement of the probe relative to the circuit board during test.

It is a further important objective of the invention to provide a capacitance measuring system of the foregoing character which has essentially universal applicability with virtually all types of circuit boards irrespective of the presence or absence or internal ground and/or power planes and irrespective of non-planar irregularities in the circuit boards themselves.

DESCRIPTION OF THE DRAWINGS

These and other objects and advantages of the present invention will become more readily apparent upon reading the following detailed description and upon reference to the attached drawing, in which.

Figure 1:
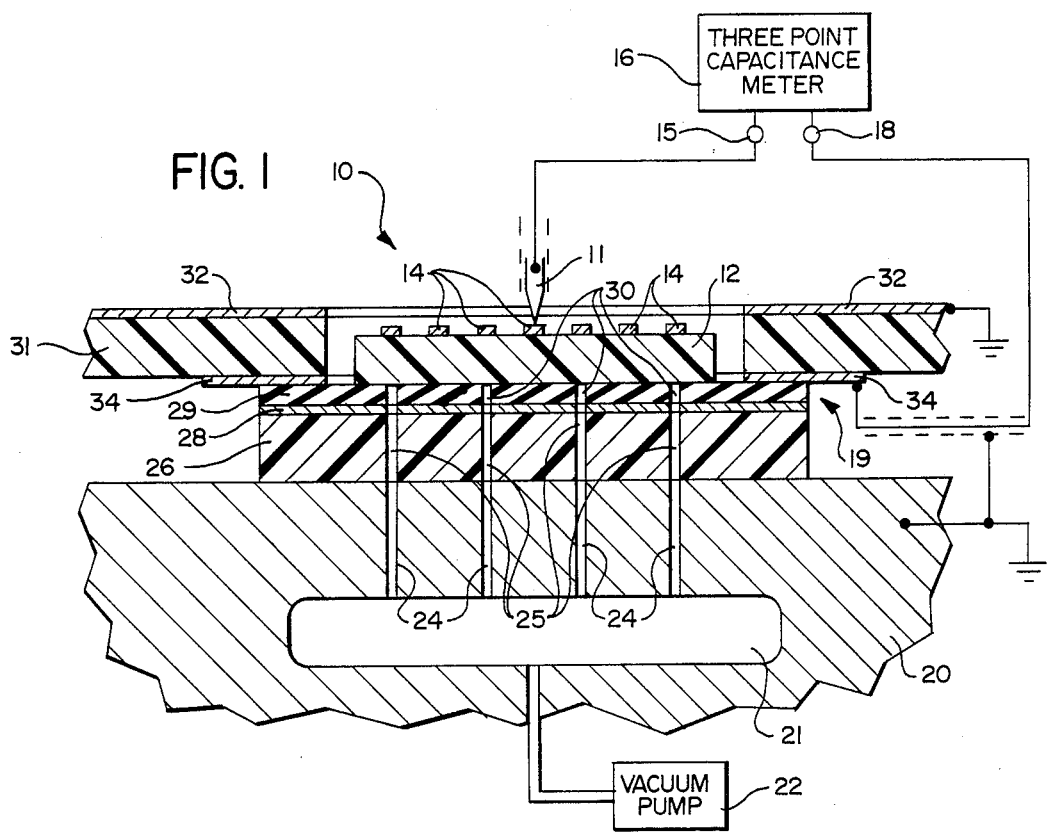
FIG. 1 is a fragmentary, highly diagrammatic, vertical, sectional view depicting a capacitive circuit board testing system embodying the features of the present invention, here illustrating the invention when used in conjunction with a conventional three point capacitance meter; and, FIG. 2 is a fragmentary, highly diagrammatic, sectional view of a slightly modified capacitive circuit board testing system embodying the present invention and as here used with a conventional four point capacitance meter.

While the invention is susceptible of various modifications and alternative forms, specific embodiments thereof have been shown by way of example in the drawings and will herein be described in detail. It should be understood, however, that it is not intended to limit the invention to the particular forms disclosed but, on the contrary, the intention is to cover all modifications, equivalents and alternatives falling within the spirit and scope of the invention as expressed in the appended claims.

DETAILED DESCRIPTION

Environment Of The Invention

Turning now to the drawings, there has been diagrammatically illustrated in FIG. 1 a capacitance circuit board testing system, generally indicated at 10, embodying the features of the present invention. As here shown, the testing system 10 includes a single shielded one-point probe 11 of conventional construction which may be shifted relative to the underlying circuit board 12 to be tested either manually or automatically by any suitable coordinate indexing mechanism (not shown) to permit electrical contact between the probe 11 and a successively presented series of n test points (where "n" is any whole integer, but, is commonly on the order of several hundred) on the circuit board 12 being tested where such n test points commonly comprise the end points on a plurality of conductive line segments 14. Although not illustrated in the drawing, those skilled in the art will appreciate that the circuit board 12 may be of: (i) the multi-layer type having y(where "y" is any whole integer) parallel vertically spaced planes or layers each containing one or more conductive line segments thereon; and/or (ii), the double-sided type. The probe 11, in this exemplary form of the invention, is coupled directly to terminal 15 on a conventional three point capacitance meter here depicted in diagrammatic block form at 16. Capacitance meter 16 is provided with a second terminal 18 coupled directly to a reference plane, generally indicated at 19, located on the backside of circuit board 12 for measuring capacitance in the particular line segment 14 undergoing test at any given instant of time. Those skilled in the art will appreciate that, as thus far described, the capacitance testing system 10 is similar to those described in, for example, the aforesaid U.S. Pat. Nos. 3,975,680—Webb and 4,229,693—Irick et al which are subject to the disadvantages hereinabove described.

In accordance with the present invention, provision is made for enhancing the precision of the capacitance measurements reflected by readings from the meter 16, either for purposes of: (i) comparison in a suitable computerized comparator system or the like (not shown) with known acceptable capacitance values for each different test point; or (ii), comparison with other capacitance readings on the same and different line segments of the particular board undergoing test—in either case to determine whether the measured reading is indicative of the presence or absence of an open and/or short. To this end, the capacitance measuring system 10 of the present invention includes a support 20 having a vacuum chamber 21 coupled to a suitable vacuum source such, for example, as a conventional vacuum pump 22. Support 20 is provided with a plurality of vacuum bores 24 extending vertically through the support and registered with a corresponding plurality of through vacuum bores 25 extending vertically through a circuit or insulator board 26 having a conductive layer 28 formed on its upper surface. A conductive pliant sheet 29 formed, for example, of a conductive elastomer such as conductive rubber or rubber-like material and including a plurality of vertically extending complementary through vacuum bores 30 is positioned on the conductive layer 28 on circuit board 26 with the through vacuum bores 24, 25 and 30 in support 20, board 26 and conductive elastomer 29, respectively, aligned. The entire assembly is held in tightly clamped sandwich-like configuration by means of an upper double-sided circuit board 31 having upper and lower spaced conductive layers 32, 34, respectively; with circuit board 31 being secured to support 20 by any suitable means such, for example, as threaded fasteners or the like (not shown). As here shown, the conductive elastomer 29 is in electrical contact with the lower conductive layer 34 on board 31, with the conductive elastomer and lower conductor 29/34 defining the reference plane 19 coupled to terminal 18 on the three point capacitance meter 16. The upper conductor 32, support 20 and shielded conductors coupled to meter terminals 15, 18 are all coupled directly to ground.

Thus, in the use of the illustrative capacitance testing system 10, the circuit board 12 to be tested is positioned on the conductive elastomer 29 with its line segments 14 to be tested open and exposed for sequential electrical contact at each test point—e.g., each line end—with the relatively movable probe 11. A vacuum is then drawn in vacuum chamber 21 so as to securely clamp the circuit board 12 and conductive elastomer 29 in intimate mutually coextensive face-to-face relation irrespective of any nonuniformities in the circuit board 12 due, for example, to warpage, non-planar curvature, or particular design irregularities therein; thus eliminating any air gap(s) between the reference plane 19 and the circuit board 12. Consequently, highly precise capacitance readings may be recorded by the three point capacitance meter 16: (i) irrespective of the presence or absence of any internal power or ground reference plane integral with the circuit board being tested; (ii) without error resulting from air gaps between the reference plane 19 and the board 12 being tested; and (iii), without the need to penetrate and/or otherwise damage thin plastic films defining an enclosed vacuum chamber surrounding the board undergoing test. Because of the nature of a capacitance testing assembly of the type here illustrated and described, n test points may be rapidly measured on a sequential point-by-point basis with a single one-point probe while making only n test measurements, thereby permitting up to on the order of 250 or more capacitance measurements per minute as contrasted with known resistance measuring systems which require at least two probes and approximately $n_2/2$ test measurement—i.e., on a circuit board 12 having 500 test points, 124,750 individual tests are required—often requiring up to several hours test time per board using relatively complex and expensive test equipment. Further, those skilled in the art will appreciate that the test circuit as described above is such that all capacitance represented by field lines to ground is excluded from each reading.

Figure 2:
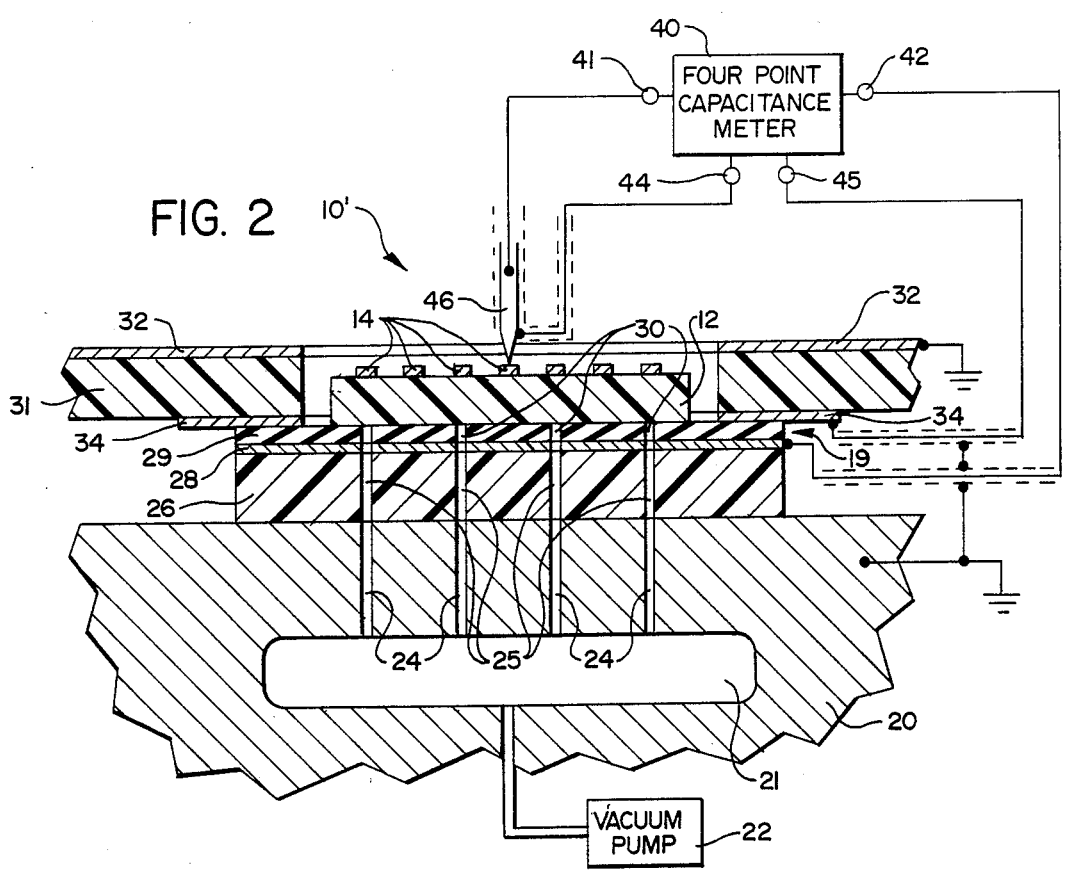

Those skilled in the art will appreciate that the simplicity and reliability of the present invention readily permit the use of other types of known test equipment. For example, referring to FIG. 2, the invention has been illustrated as comprising a capacitance circuit board testing system, generally indicated at 10', which is similar to that depicted in FIG. 1, but which here employs a conventional four point capacitance meter 40 having: (i) high-potential and low-potential drive terminals 41, 42, respectively; and (ii), high-potential and low-potential sensor terminals 44, 45, respectively. Except for the capacitance meter and the test probe, the remaining components of the capacitance circuit board testing system 40 shown in FIG. 2 are identical to those shown in FIG. 1 and need not be further described herein. In this illustrative form of the invention, the test probe comprises a conventional shielded two-point probe 46 having one point coupled directly to the high-potential drive terminal 41 on capacitance meter 40, and the other point coupled directly to the high-potential sensor terminal 44 on the meter. The low-potential drive terminal 42 on capacitance meter 40 is here coupled to the conductive layer 28 on board 26; while the low-potential sensor terminal 45 is coupled to the lower conductor 34 on circuit or insulator board 32—i.e., sensor terminal 45 is coupled directly to the conductive elastomeric backside reference plane 19.

Thus, the arrangement is such that current is driven through the system 10' and circuit board 12 undergoing test between the high- and low-potential drive terminals 41, 42 with voltage being measured at the high-and low-potential sensor terminals 44, 45. The voltage drop across the sensor terminals 44, 45 may then be used to calculate capacitance of the line segment being tested.

Those skilled in the art will appreciate that in each of the systems 10, 10' illustrated in FIGS. 1 and 2 and described hereinabove, the arrangement is such that successive boards 12 may be quickly and rapidly positioned in, and removed from, the test station at the beginning and conclusion of a board testing cycle without having to cope with any overhanging suspended reference plane such as that shown in the aforesaid U.S. Pat. No. 3,975,680—Webb and the critical air gap variations inherent therein; and, without having to insert the board into and remove the board from a completely enclosed vacuum chamber having a flexible plastic film which must be penetrated by the probe to make the necessary probe/line segment electrical contact as required in the aforesaid U.S. Pat. No. 4,229,693—Irick et al. Because the present invention permits capacitance test measurements as contrasted with resistance test measurements, the number of measurements required per board is n rather than approximately $n_2/2$, thus resulting in significant reduction of test time required per board—for example, a reduction in test time per board from several hours to only about 2 minutes for a board having on the order of 500 separate test points. At the same time, the precision of the capacitive measurements and readings have been significantly increased over other conventional capacitance test devices due to the use of a conductive elastomer as a circuit board backside reference plane, thereby eliminating air gap irregularities resulting from board warpage, curvature and/or other non-planar irregularities. Further, the system permits use with virtually all types of circuit boards including those with and without internal ground or power planes. Moreover, in all instances, the line segments on the board undergoing test are open and accessible to the user and permit of ease in establishing probe/test point electrical contact and rapid movement from test point to test point. The system may conveniently be provided with any suitable automated and/or computerized system for recording and/or displaying the measured readings on a visual and/or permanent tape-like record; and may, if desired, be provided with an auditory alarm system indicating the presence of a capacitance reading for any given test point which falls outside of predetermined acceptable upper or lower limits; thereby enabling the user to quickly retest questionable points to insure that the erroneous reading was not the result of human and/or mechanical error. Indeed, it has been found that the present invention permits of high precision capacitance readings which are generally accurate to a precision better than 1% irrespective of mechanical irregularities in the board itself undergoing test.

It has been found that, on occasion, the use of a conductive elastomeric backside reference plane can tend to short out circuit elements on the particular circuit board being tested. However, in such cases, a thin flexible sheet of insulating material (not shown) interposed between the conductive elastomer 29 and the circuit board 12 serves to prevent shorting out of circuit elements on the board while, at the same time, permits capacitance measurements as described above. Indeed, although the exemplary circuit boards 12 shown in FIGS. 1 and 2 have, for simplicity, been depicted as single layer single-sided boards, one of the principal advantages of the present invention is that it readily permits highly accurate and rapid capacitance measurements with a wide variety of different types of circuit boards—including not only single-sided boards as shown, but, also, double-sided boards and/or multilayer boards. And, when used with double-sided boards, the invention would, of course, contemplate the use of such a thin flexible sheet of insulating material interposed between the conductive elastomer 29 and the conductive line segments on the juxtaposed side of the double-sided circuit board undergoing test.

What is claimed is:

1. The method of testing electrical continuity and/or integrity of line segments on circuit boards having n test points where "n" is any whole integer by capacitance measurements comprising:
    (a) positioning the circuit board to be tested on a conductive pliant elastomeric backside reference plane with the circuit board backside surface in face-to-face relation with the conductive pliant elastomeric backside reference plane;
    (b) pressing the circuit board into mutually coextensive face-to-face contact with the conductive pliant elastomeric reference plane with the interface therebetween being devoid of any air gaps irrespective of non-planar irregularities on the circuit board;
    (c) coupling the first sensory terminal of a capacitance measuring device to the conductive pliant elastomeric reference plane;
    (d) coupling the second terminal of the capacitance measuring device to a test probe; and,
    (e) sequentially contacting the n test points with the probe to measure the capacitance of the line segments on the circuit board between the n test points and the conductive pliant elastomeric reference plane.

2. The method of testing electrical continuity and/or integrity of line segments on circuit boards as set forth in claim 1 wherein a thin flexible sheet of insulating material is interposed between the backside surface of the circuit board and the conductive pliant elastomeric reference plane.

3. The method of testing electrical continuity and/or integrity of line segments on circuit boards as set forth in claim 2 wherein the circuit board is a double-sided circuit board.

4. The method of testing electrical continuity and/or integrity of line segments on circuit boards as set forth in claim 1, 2 or 3 wherein a vacuum is applied to the backside of the circuit board through the conductive pliant elastomeric reference plane for drawing the circuit board into intimate mutually coextensive face-to-face relation with the conductive pliant elastomeric reference plane and devoid of air gaps at the interface therebetween.

5. The method of testing electrical continuity and/or integrity of line segments on circuit boards as set forth in claims 1, 2 or 3 wherein the capacitance measuring device comprises a three point capacitance meter.

6. The method of testing electrical continuity and/or integrity of line segments on circuit boards as set forth in claims 1, 2 or 3 wherein the capacitance measuring device comprises a four point capacitance meter and the test probe comprises a two-point probe.

7. In an apparatus for testing the electrical continuity and/or integrity of line segments on a circuit board having n test points where "n" is any whole integer, the improvement comprising, in combination:
    (a) a test stand support;
    (b) means defining a conductive pliant elastomeric backside reference plane mounted on said support;
    (c) means mounted on said support for pressing a circuit board to be tested into intimate, mutually coextensive face-to-face engagement with said conductive pliant elastomeric backside reference plane with said conductive pliant elastomeric reference plane conforming in configuration to the backside configuration of the circuit board and being devoid of air gaps at the interface therebetween;
    (d) capacitance measuring means having first and second sensory terminals with one of said first and second sensory terminals coupled to said conductive pliant elastomeric backside reference plane;
    (e) means defining a test probe coupled to the other of said first and second sensory terminals; and,
    (f) means for moving said probe relative to said circuit board for sequentially contacting each of the n test points thereon to provide a measurement of line segment capacitance between each of the n test points and said conductive pliant elastomeric backside reference plane.

8. Apparatus as set forth in claim 7 further including a thin flexible sheet of insulating material overlying said means defining said conductive pliant elastomeric backside reference plane.

9. Apparatus as set forth in claims 7 or 8 further including a non-conductive board having an upwardly facing conductive surface thereon interposed between said support and said conductive pliant elastomeric backside reference plane.

10. Apparatus as set forth in claims 7 or 8 further including a non-conductive board having upwardly and downwardly facing conductive surfaces thereon and defining a through opening therein sized to receive the circuit board to be tested, said non-conductive board being disposed above and upon said conductive pliant elastomeric reference plane with said downwardly facing conductive surface in electrical contact with said conductive pliant elastomeric reference plane, and means for securing said board, conductive pliant elastomeric reference plane and support in a rigid sandwich-like configuration.

11. Apparatus as set forth in claim 9 further including a non-conductive board having upwardly and downwardly facing conductive surfaces thereon and defining a through opening therein sized to receive the circuit board to be tested, said non-conductive board being disposed above and upon said conductive pliant elastomeric reference plane with said downwardly facing conductive surface in electrical contact with said conductive pliant elastomeric reference plane; and, means for securing said first named and last named non-conductive boards, conductive pliant elastomeric reference plane and support in a rigid sandwich-like configuration.

12. Apparatus as set forth in claims 7 or 8 wherein said means for pressing the circuit board to be tested into intimate mutually coextensive face-to-face engagement with said conductive pliant elastomeric reference plane comprises a vacuum system including a vacuum chamber, vacuum communicating means extending from said chamber through said conductive pliant elastomeric reference plane, and means for establishing a vacuum in said chamber to draw the circuit board deposited on said reference plane into intimate face-to-face engagement therewith.

13. Apparatus as set forth in claims 7 or 8 wherein said capacitance measuring means comprises a three point capacitance meter having a first sensory terminal connected to said probe and a second sensory terminal connected to said conductive pliant elastomeric reference plane.

14. Apparatus as set forth in claim 9 wherein said means defining said test probe comprises a two-point probe and said capacitance measuring means comprises a four point capacitance meter having first and second high- and low-potential sensory terminals respectively coupled to one point on said two-point probe and to said conductive pliant elastomeric backside reference plane and first and second high- and low-potential drive terminals respectively coupled to the other point on said two-point probe and to said upwardly facing conductive surface on said non-conductive board interposed between said support and said conductive pliant elastomeric backside reference plane.

15. Apparatus as set forth in claim 9 further including a non-conductive board having upwardly and downwardly facing conductive surfaces thereon and defining a through opening therein sized to receive the circuit board to be tested, said non-conductive board being disposed above and upon said conductive pliant elastomeric reference plane with said downwardly facing conductive surface in electrical contact with said conductive pliant elastomeric reference plane; means for securing said first named and last named non-conductive boards, conductive pliant elastomeric reference plane and support in a rigid sandwich-like configuration; and, wherein said means defining said test probe comprises a two-point probe and said capacitance measuring means comprises a four point capacitance meter having first and second high- and low-potential sensory terminals respectively coupled to one point on said two-point probe and to said conductive pliant elastomeric backside reference plane and first and second high- and low-potential drive terminals respectively coupled to the other point on said two-point probe and to said upwardly facing conductive surface on said non-conductive board interposed between said support and said conductive pliant elastomeric backside reference plane.

* * * * *